US008051561B2

(12) United States Patent
Yoon et al.

(10) Patent No.: US 8,051,561 B2
(45) Date of Patent: Nov. 8, 2011

(54) METHOD OF MANUFACTURING AN IMAGE DRUM

(75) Inventors: Eung-yeoul Yoon, Suwon-si (KR); Kae-dong Back, Hwaseong-si (KR); Kyu-ho Shin, Seoul (KR); Jin-seung Choi, Suwon-si (KR)

(73) Assignees: Samsung Electronics Co., Ltd., Suwon-si (KR); Samsung Electro-Mechanics Co., Ltd., Suwon-si (KR)

( * ) Notice: Subject to any disclaimer, the term of this patent is extended or adjusted under 35 U.S.C. 154(b) by 486 days.

(21) Appl. No.: 12/133,414

(22) Filed: Jun. 5, 2008

(65) Prior Publication Data

US 2009/0119917 A1 May 14, 2009

(30) Foreign Application Priority Data

Nov. 12, 2007 (KR) ........................ 10-2007-0114747

(51) Int. Cl.
*H01R 43/00* (2006.01)
*H05K 13/00* (2006.01)

(52) U.S. Cl. ............. 29/854; 29/592.1; 29/837; 29/842; 29/846; 29/857; 264/104; 347/141; 347/158

(58) Field of Classification Search ................. 29/592.1, 29/825, 837, 842, 846, 854, 857, 887, 895.2; 264/104; 347/141, 158
See application file for complete search history.

(56) References Cited

U.S. PATENT DOCUMENTS 5,483,269 A * 1/1996 Van Stiphout et al. ......... 347/55
5,508,727 A * 4/1996 Zur .............................. 347/112
7,784,177 B2 * 8/2010 Back et al. ...................... 29/846
2007/0138018 A1 * 6/2007 Choi et al. .................... 205/127
2007/0144009 A1 * 6/2007 Lee et al. ..................... 29/895.2

* cited by examiner

*Primary Examiner* — Paul D Kim
(74) *Attorney, Agent, or Firm* — Stanzione & Kim, LLP

(57) ABSTRACT

A method of manufacturing an image drum includes fixing a control circuit board inside the drum body so that a plurality of terminals of the control circuit board are located in the slot formed longitudinally on the drum body, forming an insulation layer to the entire external surface of the drum body, forming connection parts by removing parts of the insulation layer where the terminals of the control circuit board are formed, forming electrode forming grooves including the insulation layer as a base on the external surface of the drum body comprising the connection parts thereon, and forming a plurality of ring electrodes to be connected to respective terminals among the plurality of the terminals, respectively, through the connection parts.

15 Claims, 9 Drawing Sheets

METHOD OF MANUFACTURING AN IMAGE DRUM

CROSS-REFERENCE TO RELATED APPLICATIONS

This application claims priority under 35 U.S.C. §119 (a) from Korean Patent Application No. 10-2007-0114747, filed on Nov. 12, 2007, in the Korean Intellectual Property Office, the disclosure of which is incorporated herein by reference in its entirety.

BACKGROUND OF THE INVENTION

1. Field of the Invention

The present general inventive concept relates to an image drum and a manufacturing method thereof. More particularly, the present general inventive concept relates to an image drum which is used to an image forming apparatus for direct printing, and a manufacturing method thereof.

2. Description of the Related Art

An image forming apparatus for direct printing transmits an image signal directly to an image drum and forms an image by developing the image signal, so that a light exposure device or an electric charge device which is used for an electrophotographic image forming apparatus is not required. In addition, since the image forming apparatus for direct printing has secure features in its processing, the image forming apparatus for direct printing is constantly developing.

A conventional image drum used for the image forming apparatus for direct printing generally includes a drum body having a cylindrical shape, a plurality of ring electrodes formed on an external surface of the drum body, and a control circuit board formed inside the drum body.

The drum body is formed of aluminum or an aluminum alloy. The plurality of ring electrodes is insulated from neighboring electrodes by an insulation layer which is formed on the external surface of the drum body, and insulated with the drum body. Each ring electrode is electrically connected to a terminal installed on the control circuit board through a through hole formed in the drum body.

The terminal on the control circuit board is electrically connected to each ring electrode by a zebra strip. The control circuit board applies an appropriate voltage to the ring electrodes according to image information, and a latent image is thereby formed on the image drum.

Since the image drum generally requires fine surface processing, fine pattern processing and drilling using a laser beam, an electronic beam, or a diamond cutting tool, epoxy and dielectric film coating, and conductive particle application, the manufacturing process of the image drum is complicated and the manufacturing costs associated therewith are high.

In addition, in a conventional image drum, a multi-layer printed circuit board (PCB) constituting the control circuit board is connected to the ring electrode by a zebra strip by forming through holes on the drum body. Accordingly, the bonding force is low and problems may occur with the reliability of the image drum at times of high thermal stress.

SUMMARY OF THE INVENTION

The present general inventive concept provides a method of manufacturing an image drum, thereby reducing manufacturing costs of the image drum by simplifying the structure and the manufacturing process of the image drum.

Additional aspects and/or utilities of the present general inventive concept will be set forth in part in the description which follows and, in part, will be obvious from the description, or may be learned by practice of the general inventive concept.

The present general inventive concept provides a method of manufacturing an image drum, thereby ensuring a reliable connection between a terminal of a control circuit board and a ring electrode.

The present general inventive concept provides an image drum fabricated using the above method of manufacturing an image drum.

The foregoing and/or other aspects and utilities of the present general inventive concept may be achieved by providing a method of manufacturing an image drum including preparing a drum body comprising a slot formed longitudinally on the drum body, fixing a control circuit board inside the drum body using a fixing member so that a plurality of terminals of the control circuit board are located in the slot formed longitudinally on the drum body, coating the entire external surface of the drum body with a first insulation layer, forming connection parts by removing the first insulation layer which is formed on the terminals of the control circuit board, forming electrode forming grooves comprising the first insulation layer as a base on the external surface of the drum body comprising the connection parts thereon, and forming a plurality of ring electrodes to be connected to respective terminals among the plurality of the terminals, respectively, through the connection parts by applying a fluent conductive substance to the external surface of the drum body comprising the electrode forming grooves thereon, and by filling the electrode forming grooves with the fluent conductive substance by capillary force.

The operation of forming the electrode forming grooves may include coating the first insulation layer of the drum body comprising the connection parts thereon with a photoresist as a second insulation layer, exposing an area of the photoresist corresponding to the electrode forming grooves to light using a patterned mask, and developing the light-exposed photoresist.

The first insulation layer may include a photoresist, and the photoresist of the first insulation layer is more hydrophilic than the photoresist of the second insulation layer.

In the operation of forming the connection parts, the first insulation layer may be partially removed using photolithography processing.

The first insulation layer may include a polycarbonate or a parylene, and in the operation of forming the connection parts, the first insulation layer may be partially removed using laser beams or E-beams.

The operation of forming the plurality of ring electrodes may include blading and removing the conductive substance on the second insulation layer after applying the fluent conductive substance to the external surface of the drum body, and hardening the conductive substance filling the electrode forming grooves.

The method may further include coating the external surface of the drum body comprising the ring electrodes thereon with a dielectric layer after forming the plurality of ring electrodes.

The drum body may be formed of one of aluminum, an aluminum alloy, and a plastic, and the fixing member may be formed of an epoxy resin having insulating properties.

The foregoing and/or other aspects and utilities of the present general inventive concept may be achieved by providing a method of manufacturing an image drum including preparing a drum body which includes a slot formed longitudinally on the drum body, fixing a control circuit board inside the drum body using a fixing member such that a plurality of terminals of the control circuit board are located in the slot formed longitudinally on the drum body, coating an entire external surface of the drum body with an insulation layer, forming connection parts by removing the insulation layer which is formed on the terminals of the control circuit board, and concurrently forming electrode forming grooves comprising the insulation layer as a base on the external surface of the drum body comprising the connection parts thereon, and forming a plurality of ring electrodes to be connected to respective terminals among the plurality of terminals, respectively, through the connection parts by applying a fluent conductive substance to the external surface of the drum body comprising the electrode forming grooves thereon, and by filling the electrode forming grooves with the fluent conductive substance by capillary force.

The insulation layer may include a photoresist, and the operation of forming the electrode forming grooves may include exposing an area of the photoresist corresponding to the electrode forming grooves to light using a patterned mask, and developing the light-exposed photoresist.

The foregoing and/or other aspects and utilities of the present general inventive concept may also be achieved by providing an image drum manufactured by a method which includes preparing a drum body comprising a slot formed longitudinally on the drum body, fixing a control circuit board inside the drum body using a fixing member such that a plurality of terminals of the control circuit board corresponds to the slot formed longitudinally on the drum body, coating an entire external surface of the drum body with a first insulation layer, forming connection parts by removing portions of the first insulation layer which correspond to the terminals of the control circuit board, forming electrode forming grooves comprising the first insulation layer as a base on the external surface of the drum body comprising the connection parts formed thereon, and forming a plurality of ring electrodes to be connected to respective terminals among the plurality of the terminals through the connection parts by applying a fluent conductive substance to the external surface of the drum body comprising the electrode forming grooves thereon, and by filling the electrode forming grooves with the fluent conductive substance by a capillary force.

BRIEF DESCRIPTION OF THE DRAWINGS

These and/or other aspects and utilities of the present general inventive will become apparent and more readily appreciated from the following description of the exemplary embodiments, taken in conjunction with the accompanying drawings of which.

DETAILED DESCRIPTION OF THE PREFERRED EMBODIMENTS

Figure 1:
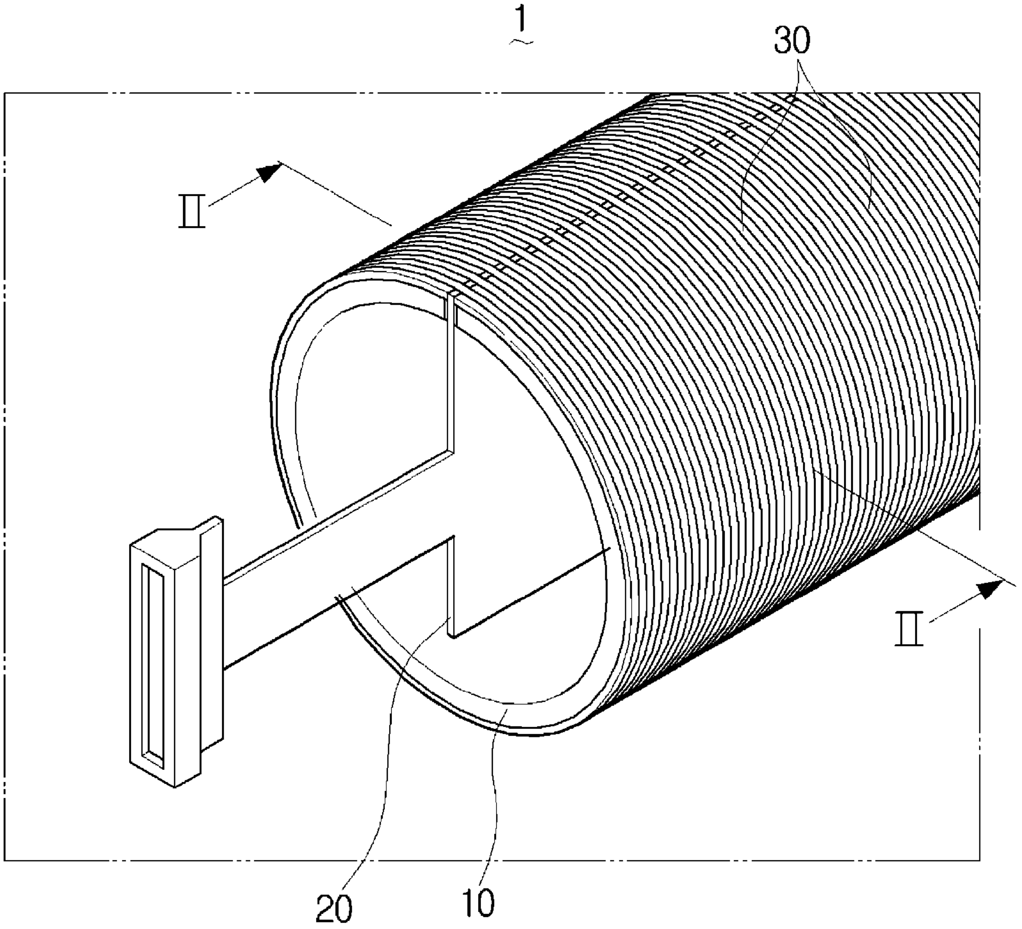
FIG. 1 is a schematic perspective view illustrating a configuration of an image drum according to an exemplary embodiment of the present general inventive concept.

Reference will now be made in detail to the present exemplary embodiments of the present general inventive concept, examples of which are illustrated in the accompanying drawings, wherein like reference numerals refer to like elements throughout. The exemplary embodiments are described below in order to explain the present general inventive concept by referring to the figures.

Figure 2:
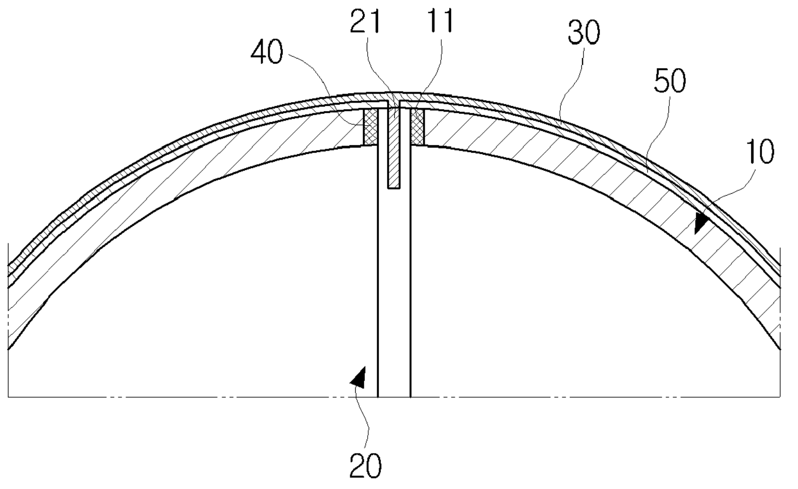
FIG. 2 is a cross sectional view cut along line II-II of FIG. 1.
Figure 3:
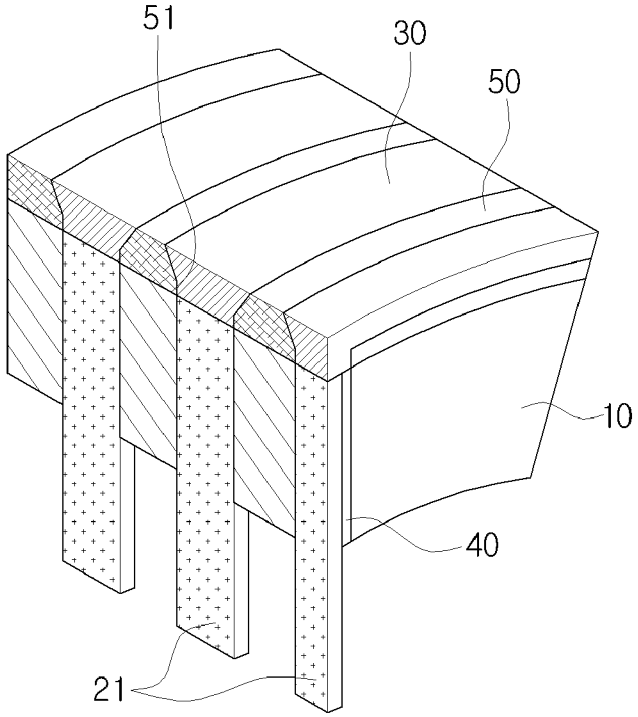
FIG. 3 is a detailed view illustrating a connection between a terminal of a control circuit board and a ring electrode.

As illustrated in FIGS. 1 to 3, an image drum 1 according to an exemplary embodiment of the present general inventive concept includes a drum body 10 having a cylindrical shape, a control circuit board 20 installed inside the drum body 10, and a plurality of ring electrodes 30 formed on an external surface of the drum body 10 in a longitudinal direction of the drum body 10, at regular intervals.

The drum body 10 is formed of aluminum, an aluminum alloy, or a plastic. However, the present general inventive concept is not limited thereto. With respect to the drum body 10, a slot 11 is formed longitudinally on the drum body 10.

A plurality of terminals 21 are formed longitudinally on the drum body 10 on one side of the control circuit board 20. A plurality of control chips (not illustrated) are mounted in the control circuit board 20. The control circuit board 20 is fixed inside the drum body 10 by a fixing member 40 such that the plurality of terminals 21 are located in the slot 11 of the drum body 10. In an exemplary embodiment, the fixing member 40 may be formed of an epoxy resin having insulating properties. However, the present general inventive concept is not limited thereto.

The plurality of terminals 21 form fine patterns which are spaced apart at a predetermined distance from the control circuit board 20 by fine patterning. Considering a resolution of an image forming apparatus having an image drum according to the present general inventive concept and a limitation and economical efficiency of manufacturing ring electrodes, a pitch of the terminals 21 may range from about 20 to about 50 μm. In an exemplary embodiment, if the resolution is 600 dpi, a pitch of the terminals 21 is about 42.3 μm. However, the pitch of the terminals 21 is not limited thereto.

In order to insulate the plurality of ring electrodes 30 from neighboring ring electrodes and from the drum body 10, the plurality of ring electrodes 30 are formed on an external surface of the drum body 10, on which an insulation layer 50 is coated to correspond to the plurality of terminals 21. Each ring electrode 30 is connected to a respective terminal 21 through a connection part 51 which is formed by selectively removing the insulation layer 50 which is formed on the terminals 21. Accordingly, a voltage can be individually applied to the ring electrodes 30 through the control circuit board 20.

In the current exemplary embodiment, a control circuit board 20 having a single layer structure is described. However, in alternative exemplary embodiments, a control circuit board 20 having a multi-layer structure including two or more layers may also be adopted. A circuit board having a multi-layer structure may be formed by arranging a plurality of terminals 21 in two or more rows in alternate directions without overlapping.

Figure 4A:
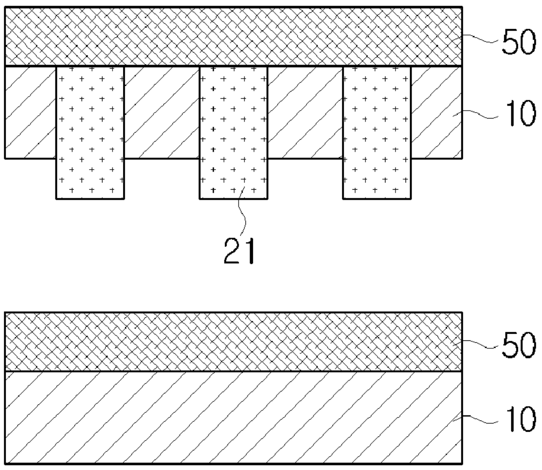
FIGS. 4A through 4F are views illustrating a method of manufacturing an image drum according to an exemplary embodiment of the present general inventive concept.
Figure 4B:
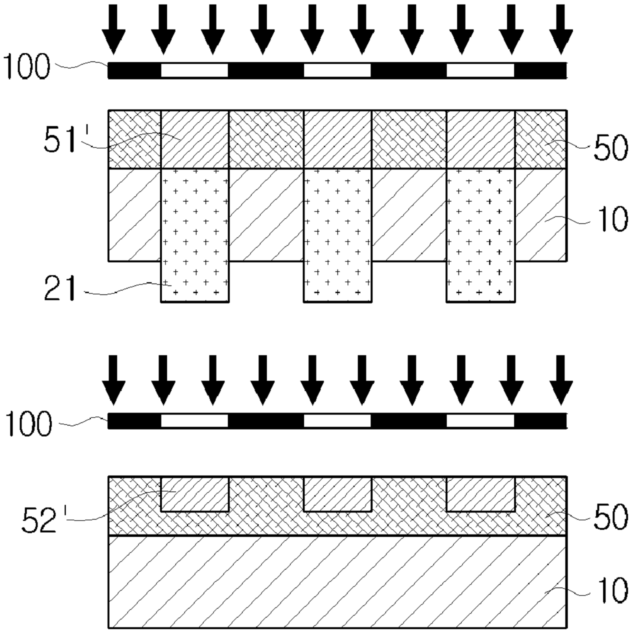
Figure 4C:
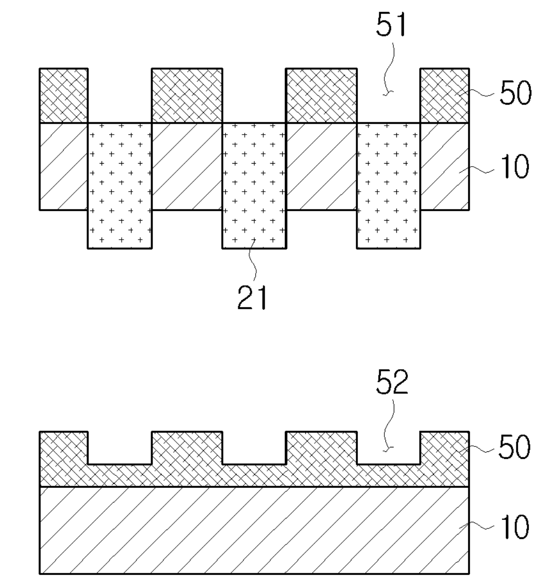

In order to manufacture an image drum according to the exemplary embodiment of the present general inventive concept as described above, the plurality of connection parts 51 are collectively formed using photolithography processing, and at the same time a plurality of ring electrode forming grooves 52 are collectively formed on the external surface of the drum body 10 (See FIG. 4C). The plurality of ring electrodes 30 are collectively formed by supplying a fluent conductive substance on the external surface of the drum body 10 and filling the plurality of ring electrode forming grooves 52 with the fluent conductive substance by a force such as a capillary force. However, the present general inventive concept is not limited thereto.

Hereinafter, a method of manufacturing an image drum according to an exemplary embodiment of the present general inventive concept having the features described above with reference to FIGS. 4A to 4F will be described. For reference, the upper drawings in FIGS. 4A through 4F illustrate an enlarged portion of the slot 11 of the drum body 10 in order to illustrate a relationship between the terminals 21 of the control circuit board 20 and the drum body 10, and the lower drawings in FIGS. 4A through 4F illustrate an enlarged portion of another part of the drum body 10.

In a method of manufacturing an image drum according to an exemplary embodiment of the present general inventive concept, a cylindrical drum body 10 having at least one slot 11 in a longitudinal direction of the drum body 10 is first obtained. In addition, a control circuit board 20 having either a single or multi-layer structure, including a plurality of terminals 21, is also obtained.

The control circuit board 20 is disposed and/or fixed inside the drum body 10 using the fixing member 40 which is formed of an epoxy resin having insulating properties such that the plurality of terminals 21 are located in the slot 11 of the drum body 10.

Subsequently, as illustrated in FIG. 4A, an insulation layer 50 is formed by applying a photoresist to an entire external surface of the drum body 10. In an exemplary embodiment, the insulation layer 50 includes a thickness of about 1 to about 10 μm.

As illustrated in FIGS. 4B and 4C, the connection parts 51 and the electrode forming grooves 52 are formed by selectively removing the insulation layer 50 by using photolithography processing. As illustrated in the FIGS. 4B and 4C, the connection parts are grooves or holes in the insulation layer 50 that extend entirely through the insulation layer 50 to the terminals 21, while the grooves 52 located at regions that do not correspond to the terminals 21 are more shallow and do not pass entirely through the insulation layer 50. However, the present general inventive concept is not limited to a photolithography process. The mask 100 used in the photolithography processing is patterned so that a connection part forming area 51' and a ring electrode forming groove area 52' of the insulation layer 50 may be exposed to light. If ultraviolet rays are applied to the insulation layer 50 interposed by the mask 100, the connection part forming area 51' and the ring electrode forming groove area 52' of the insulation layer 50 are exposed to ultraviolet rays, and the remainder of the insulation layer 50 is not exposed to the ultraviolet rays.

In the case of a positive photoresist, if the exposed insulation layer 50 is developed, the exposed insulation layer 50 is removed. Accordingly, as illustrated in FIG. 4C, the connection parts 51, which expose the terminals 21 and the electrode forming grooves 52 which are connected to the connection part 51, are formed on the drum body 10. The power of exposing light is adjusted to leave a part of the insulation layer 50 on the bottom of the electrode forming grooves 52 in order to insulate the ring electrodes 30 from the drum body 10.

Figure 4D:
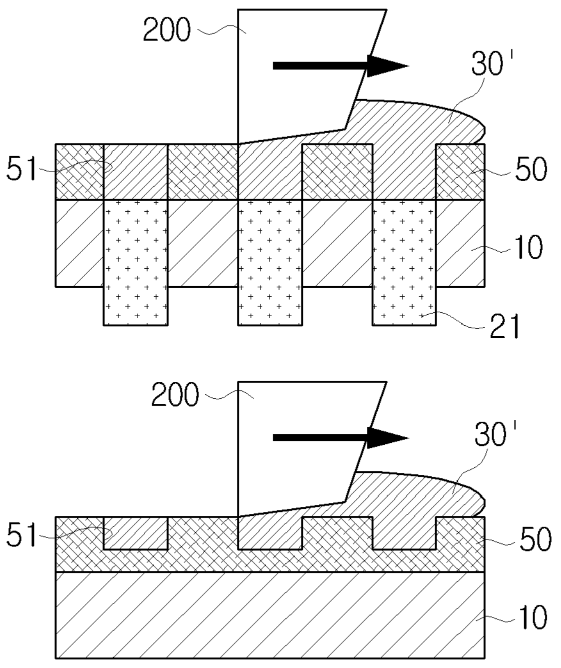

The fluent conductive substance 30' is applied to the external surface of the drum body 10 having the connection parts 51 and the electrode forming grooves 52. Subsequently, as illustrated in FIG. 4D, the connection parts 51 and the electrode forming grooves 52 are filled with the fluent conductive substance 30' by a force such as a capillary force. However, the present general inventive concept is not limited thereto.

Figure 4E:
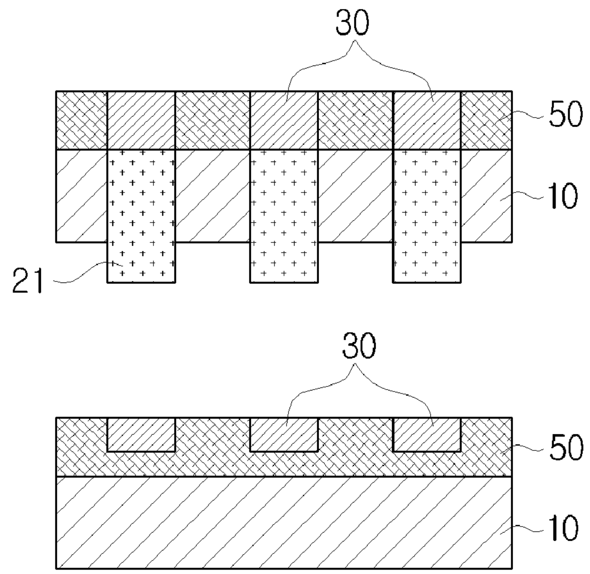

Subsequently, the external surface of the drum body 10 is bladed using a blade 200, the fluent conductive substance 30' which remains on the insulation layer 50 is thereby removed. Accordingly, as illustrated in FIG. 4E, the ring electrodes 30 are formed or disposed to be electrically connected to the terminals 21 and be insulated with the drum body 10 and neighboring electrodes 30.

Figure 4F:
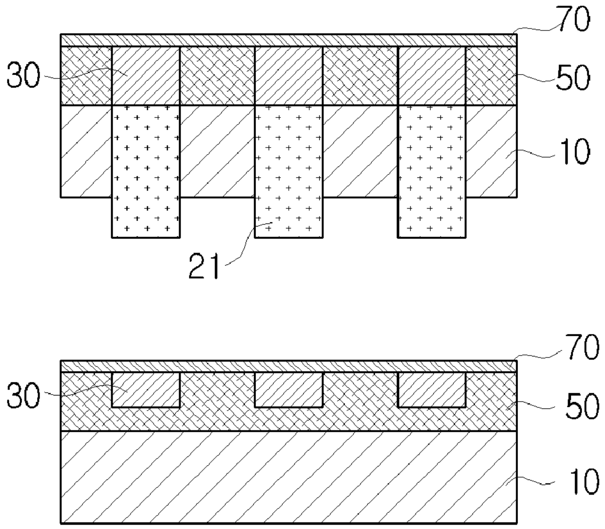

Next, as illustrated in FIG. 4F, after the conductive substance 30' hardens in the electrode forming grooves 52 for a certain period of time, a dielectric layer 70 is formed by finally applying a dielectric substance to the external surface of the drum body 10 having the plurality of ring electrodes 30 thereon.

Following the above described method of manufacturing the image drum, the plurality of connection parts 51 and the electrode forming grooves 52 are collectively formed using photolithography processing, such that the manufacturing process is simple and the manufacturing time is significantly reduced. Consequently, manufacturing costs associated therewith can also be reduced. That is, comparing the above described method with a conventional method of individually processing thousands of connection holes using a laser drill, the manufacturing time can be dramatically reduced. In addition, the plurality of connection parts 51 formed using the photolithography processing do not leave a residue, thereby ensuring a reliability of the connection between the terminals 21 and the ring electrodes 30.

FIGS. 5A through 5H are diagrams illustrating a method of manufacturing an image drum according to another exemplary embodiment of the present general inventive concept. This method includes a feature of more effectively filling the electrode forming grooves 52 of the insulation layer 50 with the fluent conductive substance by capillary force. Such a feature is described below.

In the current exemplary embodiment of the present general inventive concept, a cylindrical drum body 10 having at least one slot 11 in a longitudinal direction of the drum body 10 is obtained, as in the preceding exemplary embodiment. In addition, a control circuit board 20 of either a single or a multi-layer structure, including a plurality of terminals 21, is also obtained.

The control circuit board 20 is disposed and/or fixed inside the drum body 10 using the fixing member 40 formed of an epoxy resin having insulating properties so that the plurality of terminals 21 are located in the slot 11 of the drum body 10.

Figure 5A:
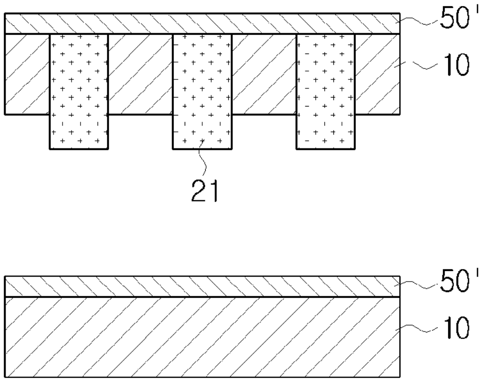
FIGS. 5A through 5H are views illustrating a method of manufacturing an image drum according to another exemplary embodiment of the present general inventive concept.

Subsequently, as illustrated in FIG. 5A, a first insulation layer 50' having a certain thickness is formed by applying a photoresist to an entire external surface of the drum body 10.

Figure 5B:
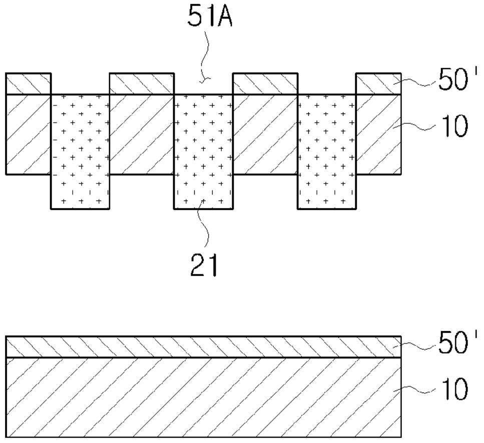

As illustrated in FIG. 5B, temporary connection parts 51A are formed by removing parts of the first insulation layer 50' which correspond to the plurality of terminals 21. In an exemplary embodiment, the temporary connection parts 51A may be formed using photolithograph processing. Since, in exemplary embodiments, a polycarbonate or a parylene may be used for the first insulation layer 50' instead of a photoresist, the temporary connection parts 51A may be formed by partially removing the first insulation layer 50' using laser beams or E-beams. However, the present general inventive concept is not limited thereto. That is, the temporary connection parts 51A may be formed by partially removing the first insulation layer 50' by using any other method conventionally used or known in the art.

Figure 5C:
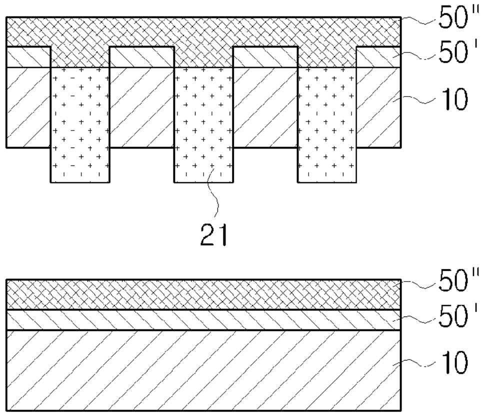

As illustrated in FIG. 5C, a second insulation layer 50" is formed on the first insulation layer 50' having the temporary connection parts 51A disposed thereon. The first insulation layer 50' includes a hydrophilicity superior to that of the second insulation layer 50". The reason and effect of applying two insulation layers having different hydrophilicity will be described below.

Figure 5D:
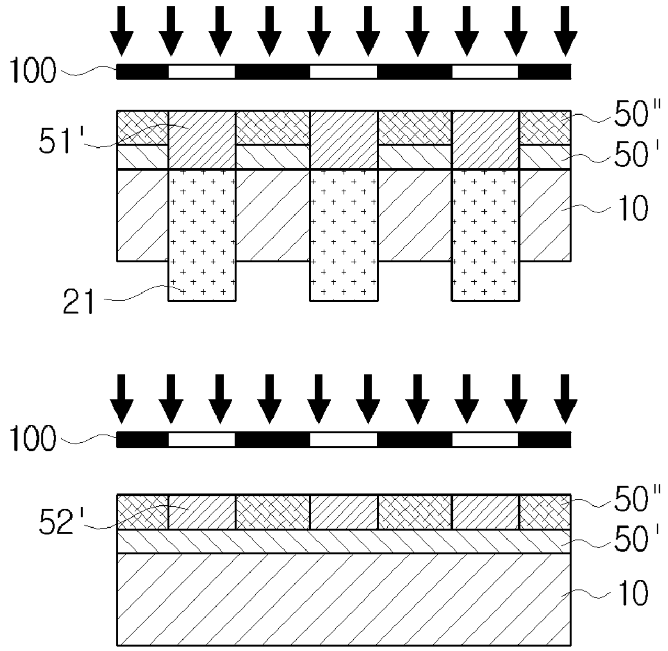
Figure 5E:
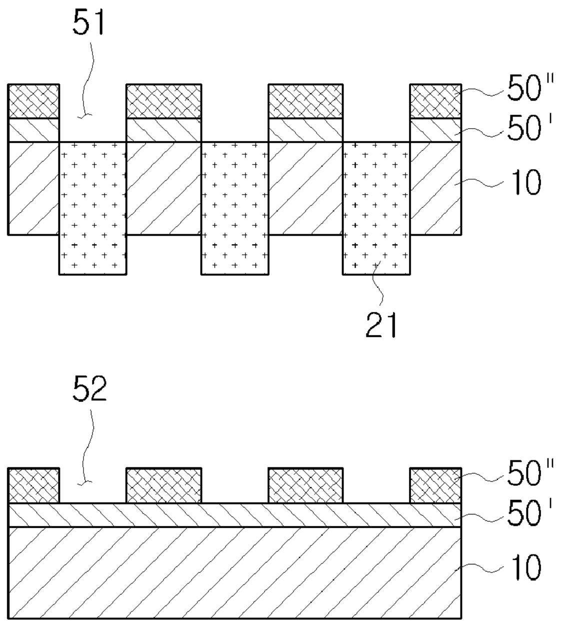
Figure 5F:
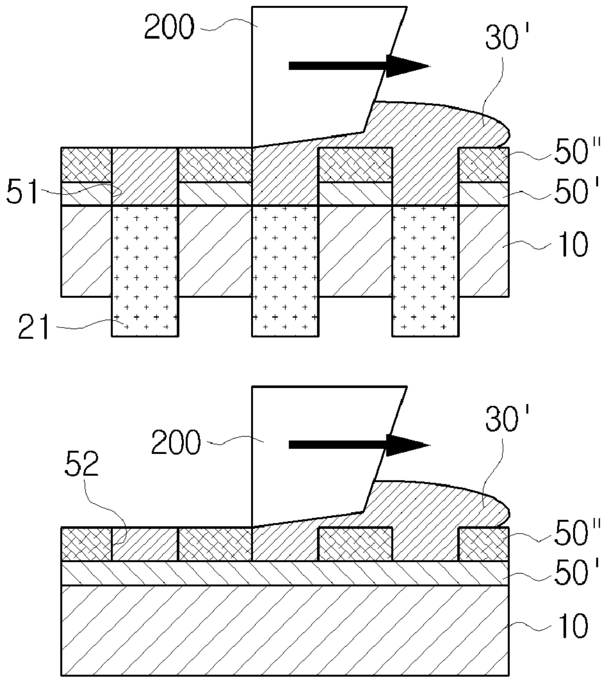
Figure 5G:
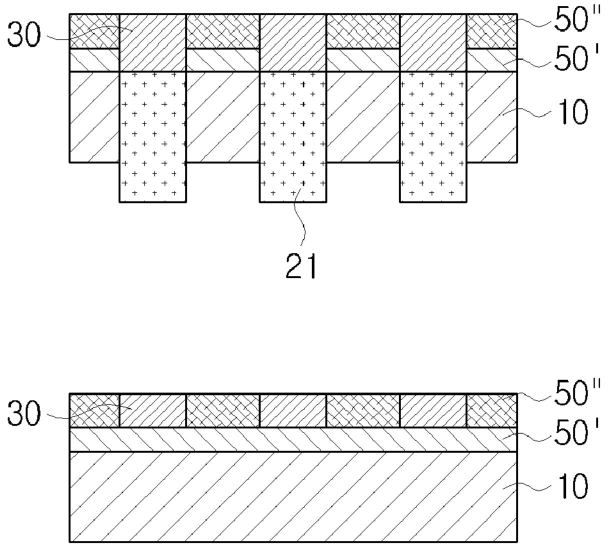
Figure 5H:
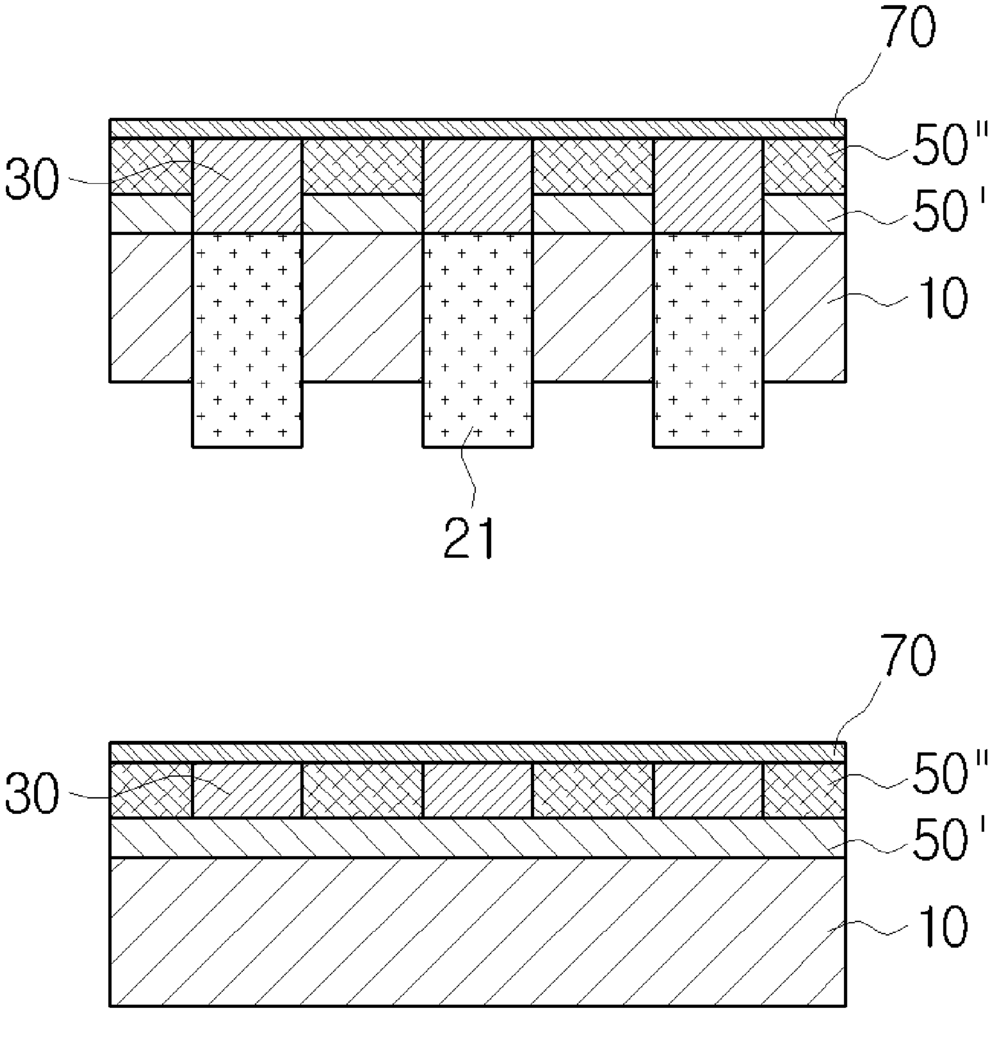

After the first and second insulation layers 50' and 50" are disposed or formed, the connection parts 51 and the electrode forming grooves 52 are formed using photolithography processing. This process is the same as the description stated above with reference to FIGS. 4B and 4C, therefore a detailed description thereof is omitted here. However, as illustrated in FIGS. 5D and 5E unlike the preceding exemplary embodiment, two side walls of the electrode forming grooves 52 are formed as the second insulation layer 50", and the bottom of the electrode forming grooves 52 is formed as the first insulation layer 50'. Since the hydrophilicity of the first insulation layer 50' is higher than that of the second insulation layer 50", the electrode forming grooves 52 may be filled with the fluent conductive substance by a force, such as capillary force, more effectively than the preceding exemplary embodiment as illustrated in FIG. 5F.

The subsequent process is the same as the preceding exemplary embodiment. Accordingly, FIGS. 5G and 5H of the current exemplary embodiment are given the same or similar reference numerals as the preceding exemplary embodiment, and therefore a detailed description thereof is omitted here.

As can be appreciated from the above description, the connection parts and the electrode forming grooves are collectively formed using photolithography processing, so that the manufacturing process is designed to be simple and the manufacturing time associated therewith is reduced. Furthermore, according to another exemplary embodiment of the present general inventive concept, an insulation layer having a high hydrophilicity is used as a base of the electrode forming grooves, so that the electrode forming grooves may be filled more effectively with a conductive substance.

Although various exemplary embodiments of the present general inventive concept have been illustrated and described, it will be appreciated by those skilled in the art that changes may be made in these exemplary embodiments without departing from the principles and spirit of the general inventive concept, the scope of which is defined in the appended claims and their equivalents.

What is claimed is:

1. A method of manufacturing an image drum, the method comprising:

preparing a drum body comprising a slot formed longitudinally on the drum body;

fixing a control circuit board inside the drum body using a fixing member such that a plurality of terminals of the control circuit board corresponds to the slot formed longitudinally on the drum body;

coating an entire external surface of the drum body with a first insulation layer;

forming connection parts by removing portions of the first insulation layer which correspond to the terminals of the control circuit board, and concurrently forming electrode forming grooves having the first insulation layer as a base on the external surface of the drum body at portions of the first insulation layer where the connection parts are not formed; and forming a plurality of ring electrodes by applying a fluent conductive substance to the electrode forming grooves and the connection parts of the external surface of the drum body, and by filling the electrode forming grooves with the fluent conductive substance by a capillary force to connect the plurality of ring electrodes to respective terminals from among the plurality of terminals.

2. The method of claim 1, wherein the operation of forming the electrode forming grooves comprises:

coating the first insulation layer of the drum body on which the connection parts have been formed with a photoresist as a second insulation layer;

exposing an area of the photoresist corresponding to the electrode forming grooves to light using a patterned mask; and developing the light-exposed photoresist.

3. The method of claim 2, wherein the first insulation layer comprises a photoresist, and the photoresist of the first insulation layer is more hydrophilic than the photoresist of the second insulation layer.

4. The method of claim 3, wherein in the operation of forming the connection parts, portions of the first insulation layer are removed using photolithography processing.

5. The method of claim 1, wherein the first insulation layer comprises a polycarbonate or a parylene, and in the operation of forming the connection parts, portions of the first insulation layer are removed using laser beams and/or E-beams.

6. The method of claim 1, wherein the operation of forming the plurality of ring electrodes comprises:

blading and removing the conductive substance on the first insulation layer after applying the fluent conductive substance to the external surface of the drum body; and hardening the conductive substance filling the electrode forming grooves.

7. The method of claim 1, further comprising:

coating the external surface of the drum body comprising the ring electrodes with a dielectric layer after forming the plurality of ring electrodes.

8. The method of claim 1, wherein the drum body is formed of one of aluminum, an aluminum alloy, and a plastic.

9. The method of claim 1, wherein the fixing member is formed of an epoxy resin having insulating properties.

10. A method of manufacturing an image drum, the method comprising:

preparing a drum body comprising a slot formed longitudinally on the drum body;

fixing a control circuit board inside the drum body using a fixing member such that a plurality of terminals of the control circuit board correspond to the slot formed longitudinally on the drum body;

coating an entire external surface of the drum body with an insulation layer;

forming connection parts by removing portions of the insulation layer which correspond to the terminals of the control circuit board, and concurrently forming electrode forming grooves comprising the insulation layer as a base on portions of the external surface of the drum body that do not include the connection parts; and forming a plurality of ring electrodes to be connected to respective terminals among the plurality of terminals through the connection parts by applying a fluent conductive substance to the electrode forming grooves and the connection parts of the external surface of the drum body, and by filling the electrode forming grooves with the fluent conductive substance by a capillary force.

11. The method of claim 10, wherein the insulation layer comprises a photoresist, and the operation of forming the electrode forming grooves comprises:

exposing an area of the photoresist corresponding to the electrode forming grooves to light using a patterned mask; and developing the light-exposed photoresist.

12. The method of claim 10, wherein the operation of forming the plurality of ring electrodes comprises:

blading and removing the conductive substance on the insulation layer after applying the fluent conductive substance to the external surface of the drum body; and hardening the conductive substance filling the electrode forming grooves.

13. The method of claim 10, further comprising:

coating the external surface of the drum body comprising the ring electrodes with a dielectric layer after forming the plurality of ring electrodes.

14. The method of claim 10, wherein the drum body is formed of one of aluminum, an aluminum alloy, and a plastic.

15. The method of claim 10, wherein the fixing member is formed of an epoxy resin having insulating properties.

* * * * *